(12) United States Patent
Otte et al.

(10) Patent No.: US 9,893,645 B2
(45) Date of Patent: *Feb. 13, 2018

(54) METHOD FOR OPERATING AN ACTIVE RECTIFIER, CIRCUIT SYSTEM, AND COMPUTER PROGRAM FOR CONTROLLING A SWITCHING BETWEEN MODES OF OPERATION OF AN ACTIVE RECTIFIER

(71) Applicant: Robert Bosch GmbH, Stuttgart (DE)

(72) Inventors: Christopher Otte, Reutlingen (DE); Paul Mehringer, Stuttgart (DE); Wolfgang Feiler, Reutlingen (DE)

(73) Assignee: SEG Automotive Germany GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/109,708

(22) PCT Filed: Dec. 19, 2014

(86) PCT No.: PCT/EP2014/078746
§ 371 (c)(1),
(2) Date: Jul. 5, 2016

(87) PCT Pub. No.: WO2015/104174
PCT Pub. Date: Jul. 16, 2015

(65) Prior Publication Data
US 2016/0329827 A1 Nov. 10, 2016

(30) Foreign Application Priority Data

Jan. 9, 2014 (DE) .......................... 10 2014 200 166
Jan. 14, 2014 (DE) .......................... 10 2014 200 503

(51) Int. Cl.
*H02M 1/32* (2007.01)
*H02M 1/084* (2006.01)
(Continued)

(52) U.S. Cl.
CPC ............. *H02M 7/217* (2013.01); *H02M 1/08* (2013.01); *H02M 1/32* (2013.01); *H03K 17/08* (2013.01); *H03K 17/22* (2013.01)

(58) Field of Classification Search
CPC ........ H02M 1/084; H02M 1/088; H02M 1/32; H02M 7/2173; H02M 7/219
(Continued)

(56) References Cited

U.S. PATENT DOCUMENTS 6,992,906 B1  1/2006 Herbert
2001/0002782 A1  6/2001 Shimane et al.
(Continued)

FOREIGN PATENT DOCUMENTS

DE  102009046955  5/2011
DE  102011051642  3/2012
(Continued)

OTHER PUBLICATIONS

International Search Report dated Apr. 16, 2015 in International Application PCT/EP2014/078746, filed Dec. 19, 2014.
(Continued)

*Primary Examiner* — Jeffrey Sterrett
(74) *Attorney, Agent, or Firm* — Norton Rose Fulbright US LLP; Gerard A. Messina

(57) ABSTRACT

A method for operating an active rectifier including a multitude of controllable semiconductor switching elements, in which a switch is carried out between a first control mode and a second control mode for controlling the semiconductor switching elements, and vice versa, the semiconductor switching elements being controlled with a first
(Continued)

switching time in the first control mode and with a second switching time in the second control mode, the second switching time being greater than the first switching time.

12 Claims, 4 Drawing Sheets

(51) Int. Cl.
*H02M 7/217* (2006.01)
*H02M 1/08* (2006.01)
*H03K 17/22* (2006.01)
*H03K 17/08* (2006.01)

(58) Field of Classification Search
USPC .............................................. 363/53, 89, 127
See application file for complete search history.

(56) References Cited

U.S. PATENT DOCUMENTS

| | | |
|---|---|---|
| 2005/0128671 A1 | 6/2005 | Miyamoto |
| 2008/0211473 A1 | 9/2008 | Tlasksl et al. |
| 2010/0019808 A1 | 1/2010 | Fuma et al. |
| 2013/0155560 A1 | 6/2013 | Takeuchi |
| 2014/0362625 A1* | 12/2014 | Mehringer ............ H02M 7/219 363/127 |
| 2015/0229230 A1* | 8/2015 | Mehringer ............ H02H 7/067 363/127 |
| 2016/0144724 A1* | 5/2016 | Otte ........................ H02M 1/32 307/10.1 |
| 2016/0211740 A1* | 7/2016 | Schueler ................ H02P 25/22 |
| 2016/0257206 A1* | 9/2016 | Otte ........................ H02H 7/067 |
| 2016/0294181 A1* | 10/2016 | Otte ........................ H02H 7/067 |
| 2016/0329827 A1* | 11/2016 | Otte ........................ H03K 17/22 |

FOREIGN PATENT DOCUMENTS

| | | |
|---|---|---|
| DE | 102011006316 | 10/2012 |
| DE | 102012215561 | 3/2014 |
| EP | 2560283 | 2/2013 |

OTHER PUBLICATIONS

Chokhawala, R. et al. "Switching Voltage Transient Protection Schemes for High Current IGBT Modules," Proceedings of the Annual Applied Electronixs Conference and Exposition (APEC), Orlando, Feb. 13-17, 1994, New York, IEEE, pp. 459-468, XP000467352.

* cited by examiner

METHOD FOR OPERATING AN ACTIVE RECTIFIER, CIRCUIT SYSTEM, AND COMPUTER PROGRAM FOR CONTROLLING A SWITCHING BETWEEN MODES OF OPERATION OF AN ACTIVE RECTIFIER

FIELD

The present invention relates to a method for operating an active rectifier, to a circuit system, and to a computer program.

BACKGROUND INFORMATION

In conventional motor vehicles, a 14V vehicle electrical system is supplied with electrical energy via a 14V generator. The generator is generally a three-phase or multiphase electric machine, which is driven by the internal combustion engine of the motor vehicle and generates polyphase current which is rectified by a rectifier.

Since the excitation winding of the generator has a very high inductance, during an abrupt load drop, which is referred to as a "load dump," initially an unreduced electric current continues to be fed into the vehicle electrical system and a high voltage continues to be generated. Depending on the capacitance present in the vehicle electrical system, the voltage value exceeds the maximum voltage limit of the vehicle electrical system within a few milliseconds. The generator current decays at the time constant of the excitation field, resulting in a maximum load dump time of several 100 ms.

A rectifier may be formed of Zener diodes, which during normal operation act as current valves and cause a rectification, but in the special case of a load dump may also limit the occurring electric overvoltages by conductive the generator current to ground via the Zener breakdown, instead of feeding it into the vehicle electrical system. This is referred to as passive rectification, and this type of voltage limitation is referred to as voltage clamping.

In the case of an active rectification, each diode is replaced with a power MOSFET including an intrinsic body diode, which is antiparallel to the channel of the power MOSFET between the drain and the source and functions without control of the gate of the MOSFET in a manner identical to a diode rectifier. Through suitable, rapid voltage forcing with the aid of a gate driver, the MOSFET may always be switched on whenever the phase current is to flow through it, i.e., the intrinsic diode of the MOSFET is short-circuited by the channel of the MOSFET. Compared to the passive rectifier, a considerably reduced forward voltage arises at the source-drain channel in this way, and accordingly the efficiency and the output power of the generator at low rotational speeds are increased. A rapid control of the MOSFET is needed to actually switch at the zero crossing so as not to generate additional ripple of the rectified output voltage. Both a fast evaluation of the phase voltage and a sufficiently high gate driver current are needed for this purpose, i.e., a preferably low-resistance control of the gate.

In the case of a load dump, an evaluation circuit detects an electric overvoltage at the positive pole of the active rectifier and electrically short-circuits the connected phase to the reference potential (ground) or to the positive pole of the active rectifier. In a multiphase system, the phase short circuit is brought about, either autonomously for each phase or controlled via a synchronization line, on all further phases so that the generator no longer feeds any electric current into the vehicle electrical system.

If voltage gradients at the MOSFET gate are too steep during the deactivation/activation of the phase short circuit, the large gradients of the generator current, in conjunction with the cable inductance of the connecting line between the capacitance in the vehicle electrical system and the generator, cause high voltage peaks, in absolute terms, in the case of an active rectifier. These may damage a control unit of the generator. The switching process for deactivation/activation of the phase short circuit is therefore advantageously carried out slowly, i.e., with a long switching time.

During normal rectifier operation, however, switching processes must be carried out quickly, i.e., with a shorter switching time, in particular in cases where operation takes place at high rotational speeds and high generator currents.

Switching denotes the transition between the "conductive" and "non-conductive" states. A "long switching time" or "slow switching" in the context described here denotes a slow transition between the "conductive" and "non-conductive" states; in contrast, a "short switching time" or "fast switching" denotes a fast transition.

Slow switching may be achieved during the phase short circuit by high-resistance, fast switching, and during the active rectification by a low-resistance control of the MOSFET gate.

In order to meet these two requirements—high-resistance control with deactivation/activation during the phase short circuit and low-resistance control during the active rectifier operation—a switch takes place between two driver mechanisms. During normal operation, a voltage is provided with low resistance, while during phase short circuit operation a precisely set current source is connected to the output.

The crucial aspect is when a change between high-resistance and low-resistance operation is carried out. Switching at the wrong point in time may result in undesirably fast switching, and thus in voltage peaks, which may destroy the electrical components of the control unit.

A need therefore exists for a method for determining the point in time for a switch in the control.

SUMMARY

Against this background, the present invention provides for a method for operating an active rectifier, a circuit system, and a computer program having the features of the independent patent claims.

In accordance with the present invention is that, in a method for operating an active rectifier including a multitude of controllable semiconductor switching elements in which a switch is carried out between a first control mode and a second control mode for controlling the semiconductor switching elements, and vice versa, the following steps a) through c) and/or d) through f) are carried out:
a) detecting an output variable value of an electrical output variable of the rectifier;
b) comparing the output variable value to a comparative value;
c) switching from the first control mode into the second control mode when the output variable value is greater than the comparative value;
d) detecting an operating variable value of an electrical operating variable of one of the semiconductor switching elements;
e) comparing the operating variable value to a comparative value; and f) switching from the second control mode into the first control mode when the operating variable value is greater than the comparative value;

the semiconductor switching elements being controlled with a first switching time in the first control mode and with a second switching time in the second control mode, the second switching time being greater than the first switching time. In this way, it is achieved that a switch at the wrong time is prevented. Voltage peaks are thus avoided, which otherwise could result in a destruction of electrical components, e.g., of a control unit of the circuit system, due to a switching time which is too short.

According to one further specific embodiment, an electric operating voltage is used as the electrical operating variable. In this way, it is achieved that a measured variable is used which is easy to detect and is to be further processed.

According to one further specific embodiment, MOSFETS which each have a body diode are used as semiconductor switching elements, a drain-source voltage of one of the semiconductor switching elements being used as the electric operating voltage. In this way, it is achieved that reliable and inexpensive components may be used to create the circuit system. It is furthermore achieved that no voltage peaks or drops beyond a certain limit are created during a switch into the first control mode, since due to the energization of the body diode only a small difference in the drain-source voltage exists between the case in which the drain-source channel is conductive and the case in which the drain-source channel is non-conductive.

According to one further specific embodiment, the value of the electric operating voltage is between 0 volt and a voltage which drops across the body diode. In this way, it is achieved that the natural voltage limitation of the body diode is used, so that the circuit system has a particularly simple design without additional, further components.

According to one further specific embodiment, an output-side load dump at the rectifier is detected, and a switch is carried out from the first control mode into the second control mode in response to the output-side load dump. In this way, it is achieved that a switch at a wrong point in time is prevented, which would impair the functional capability of the circuit system.

According to one specific embodiment, a value of an electrical output variable of the rectifier is detected for detecting the load dump, the value is compared to a threshold value, and a switch is carried out from the first control mode into the second control mode when the value is greater than the threshold value. In this way, it is achieved that a load drop is reliably detected in a particularly simple manner.

According to one further specific embodiment, the electrical output variable is filtered to determine the value. In this way, it is achieved that interference signals are eliminated from the measuring result, so that a switch in the control mode based on interference signals superimposed on the measuring result is avoided.

According to one further specific embodiment, an electric output voltage is used as the output variable. In this way, it is achieved that a measured variable is used which is easy to detect and is to be further processed.

A further aspect relates to a circuit system including an active rectifier having a multitude of controllable semiconductor switching elements, the semiconductor switching elements being operable in a first control mode and in a second control mode, the semiconductor switching elements being controllable with a first switching time in the first control mode and with a second switching time in the second control mode, the second switching time being greater than the first switching time, and the circuit system including a control unit which is designed to carry out all steps of a method as it was provided above and is described hereafter in greater detail.

An implementation of the method in the form of a computer program is also advantageous since this results in particularly low costs, in particular when the executing processing device is also used for additional tasks and is therefore present anyhow. Suitable data carriers for providing the computer program are in particular floppy disks, hard disks, flash memories, EEPROMs, CD-ROMs, DVDs, and the like. It is also possible to download a program via computer networks (Internet, Intranet, and the like). The present invention relates in particular to a machine-readable storage medium having a corresponding computer program stored thereon. The computer program may include components which are designed to operate the circuit system according to the method.

Further advantages and embodiments of the present invention are derived from the description and the accompanying drawings.

It shall be understood that the above-mentioned features and those still to be described hereafter may be used not only in the particular described combination, but also in other combinations, or alone, without departing from the scope of the present invention.

The present invention is schematically shown based on one exemplary embodiment in the figures and is described in greater detail below with reference to the figures.

DETAILED DESCRIPTION OF EXAMPLE EMBODIMENTS

Figure 1:
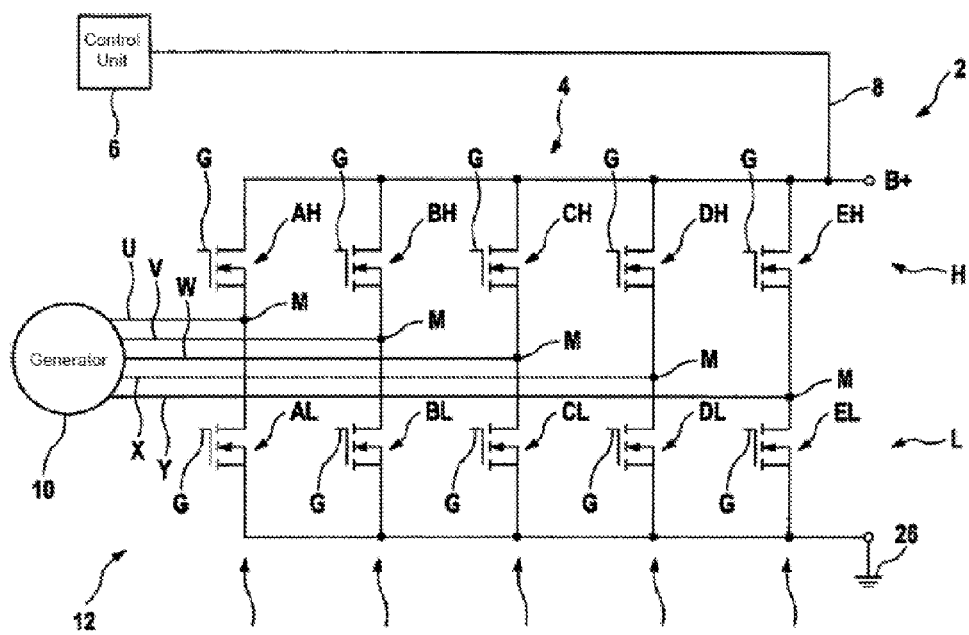
FIG. 1 shows a vehicle electrical system including an active rectifier, a generator, and a control unit in a schematic partial representation.

FIG. 1 schematically illustrates a section of a vehicle electrical system 12, such as a vehicle electrical system of a motor vehicle. The section includes a circuit system 2 which has an active rectifier 4 and is electrically conductively connected to a generator 10.

In the exemplary embodiment shown in FIG. 1, active rectifier 4 is designed as a ten-pulse bridge rectifier, which is designed to rectify electric polyphase current, which in the present exemplary embodiment is provided by generator 10 having a five-phase design. In the same manner, however, it is also possible, for example, to use a three-, four-, six- or seven-phase generator and a six-, eight-, twelve- or fourteen-pulse bridge rectifier appropriately adapted thereto.

Active rectifier 4 includes five half bridges A through E in the present exemplary embodiment. Half bridges A through E each include two semiconductor switching elements AH through EH and AL through EL. In the present exemplary embodiment, semiconductor switching elements AH through EH and AL through EL each include one MOSFET. In the present exemplary embodiment, each of the five half bridges A through E includes one high-side MOSFET and one low-side MOSFET. These are integrated in each case into a high side H and a low side L of individual half bridges A through E. Furthermore, each half bridge A through E includes a center tap M. Each center tap M is electrically conductively connected to one of the five generator phases or the corresponding phase terminals U through Y.

Half bridges A through E are connected at their respective ends to a DC voltage terminal B+ and a ground terminal 26, for example battery poles and/or corresponding supply lines of vehicle electrical system 12.

Phase terminals U through Y may each be electrically connected with low resistance to DC voltage terminal B+ or to ground terminal 26 in accordance with a corresponding control of active semiconductor switching elements AH through EH and AL to EL. If two or more phase terminals U through Y are each connected to the same DC voltage terminal B+ or ground terminal 26, this equates to a short circuiting of these phase terminals U through Y via the particular DC voltage terminal B+ or ground terminal 26.

The control of semiconductor switching elements AH through EH and AL through EL takes place via their respective gate terminals G with the aid of a control unit 6. Control unit 6 may be electrically conductively connected for this purpose to gate terminals G via control lines (not shown). In the present exemplary embodiment, control unit 6 is provided for all half bridges A through E together. Alternatively, each of half bridges A through E may include an individual control unit. If the latter is the case, functions may be arbitrarily distributed between individual control units and shared control unit 6.

The normal operation of generator 10 includes controlling semiconductor switching elements AH through EH and AL through EL in such a way that electric current signals present at phase terminals U through Y are alternately conducted to DC voltage terminal B+ and ground terminal 26, as is generally conventional.

A load dump, and a sudden reduction in the electric current required in vehicle electrical system 12 caused thereby, is detectable in a system shown in FIG. 1 based on a voltage present at DC voltage terminal B+, for example. For this purpose, control unit 6 is connected via an electrical line 8 to DC voltage terminal B+. When an electrical operating variable of active rectifier 4 exceeds, e.g., a value of a voltage at DC voltage terminal B+, i.e., a threshold value, then a load dump is present.

The control of active rectifier 4 in the case of a detected load dump may include short-circuiting phase terminals U through Y to DC voltage terminal B+ or ground terminal 26 for a limited time. The electric current fed into vehicle electrical system 12 consequently drops to zero, and a voltage detected via line 8 drops. A corresponding short circuit may be established by simultaneously controlling, and thus making conductive, several or all semiconductor switching elements AH through EH on the one hand, or AL through EL on the other, i.e., several or all semiconductor switching elements of a rectifier side H or L. When an electrical operating variable of active rectifier 4 drops below, e.g., a value of a voltage at DC voltage terminal B+, i.e., a further threshold value, the phase short circuit is released again. When such a short circuit is released, the value of the electric current fed into vehicle electrical system 12 increases, and the voltage value detected via line 8 also increases.

Figure 2:
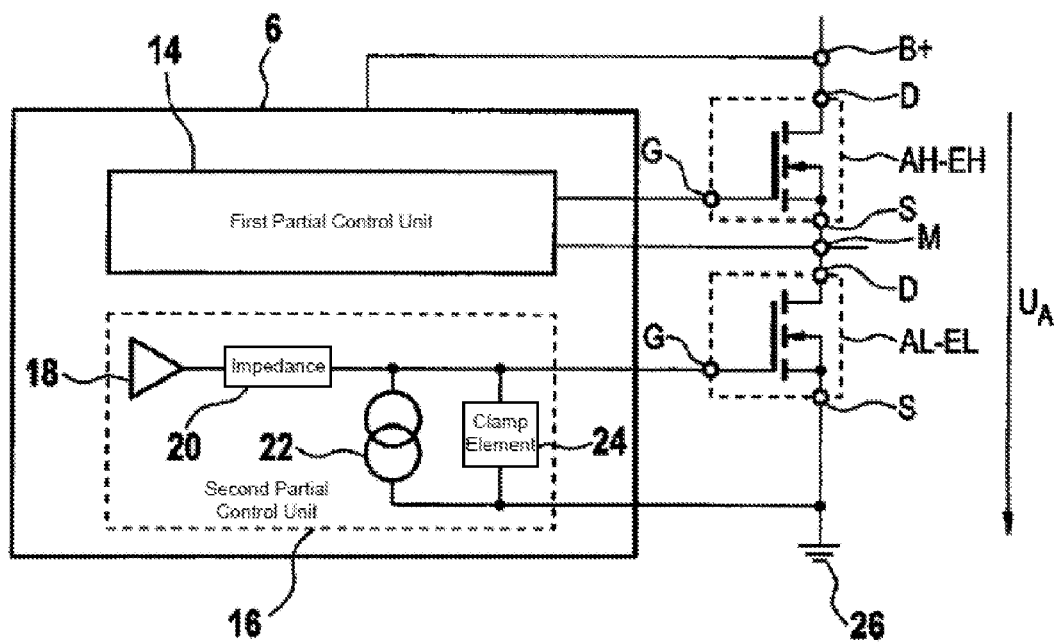
FIG. 2 shows a section of FIG. 1 in detail.

FIG. 2 shows a section of circuit system 1 shown in FIG. 1 for rectifying one of phases U through Y. Circuit system 2 shown in FIG. 1 accordingly shows the section shown in FIG. 2 for each of phases U through Y. FIG. 2 refers to the present exemplary embodiment in which the phase short circuit to ground terminal 26 is carried out. In this case, only a second partial control unit 16 is switchable between first control mode M1 and second control mode M2, while a first partial control unit 14 of control unit 6 is not.

FIG. 2 shows that, in the present exemplary embodiment, in addition to first partial control unit 14, second partial control unit 16 is assigned to control unit 6. According to the present exemplary embodiment, first partial control unit 14 is designed to control semiconductor switching elements AH through EH on the high side H, while second partial control unit 16 is designed to control semiconductor switching elements AL through EL on the low side L.

According to the present exemplary embodiment, first partial control unit 14 is electrically conductively connected on the output side to gate terminal G for controlling semiconductor switching elements AH through EH on the high side.

According to the present exemplary embodiment, second partial control unit 16 includes a driver 18, a switchable impedance 20 for second, high-resistance control mode M2 (HiZ mode), a current source 22, and a clamp element 24 designed as a Zener diode, for example. Low-resistance driver 18 is electrically conductively connected to the source terminals of semiconductor switching elements AL through EL. Switchable impedance 20 is electrically conductively connected in series to driver 18. Current source 22 and clamp element 24 are electrically conductively connected in parallel to the series connection, made up of driver 18 and switchable impedance 20. On the output side, second partial control unit 16 for controlling semiconductor switching elements AL through EL on the low side is electrically conductively connected to gate terminal G. Clamp element 24 is used to limit the voltage at gate G of associated semiconductor switching elements AL through EL to non-critical values for semiconductor switching elements AL through EL.

According to the present exemplary embodiment, first partial control unit 14 includes only one driver (not shown) having a low internal resistance, analogously to driver 18 in second partial control unit 16, and one clamp element (not shown), analogously to clamp element 24 in second partial control unit 16, between gate terminal G of semiconductor switching elements AH through EH and center tap M of the respective associated phase.

The operating mode of circuit system 2 and the method sequence for operating rectifier 4 are now described based on FIGS. 3 through 8.

Figure 3:
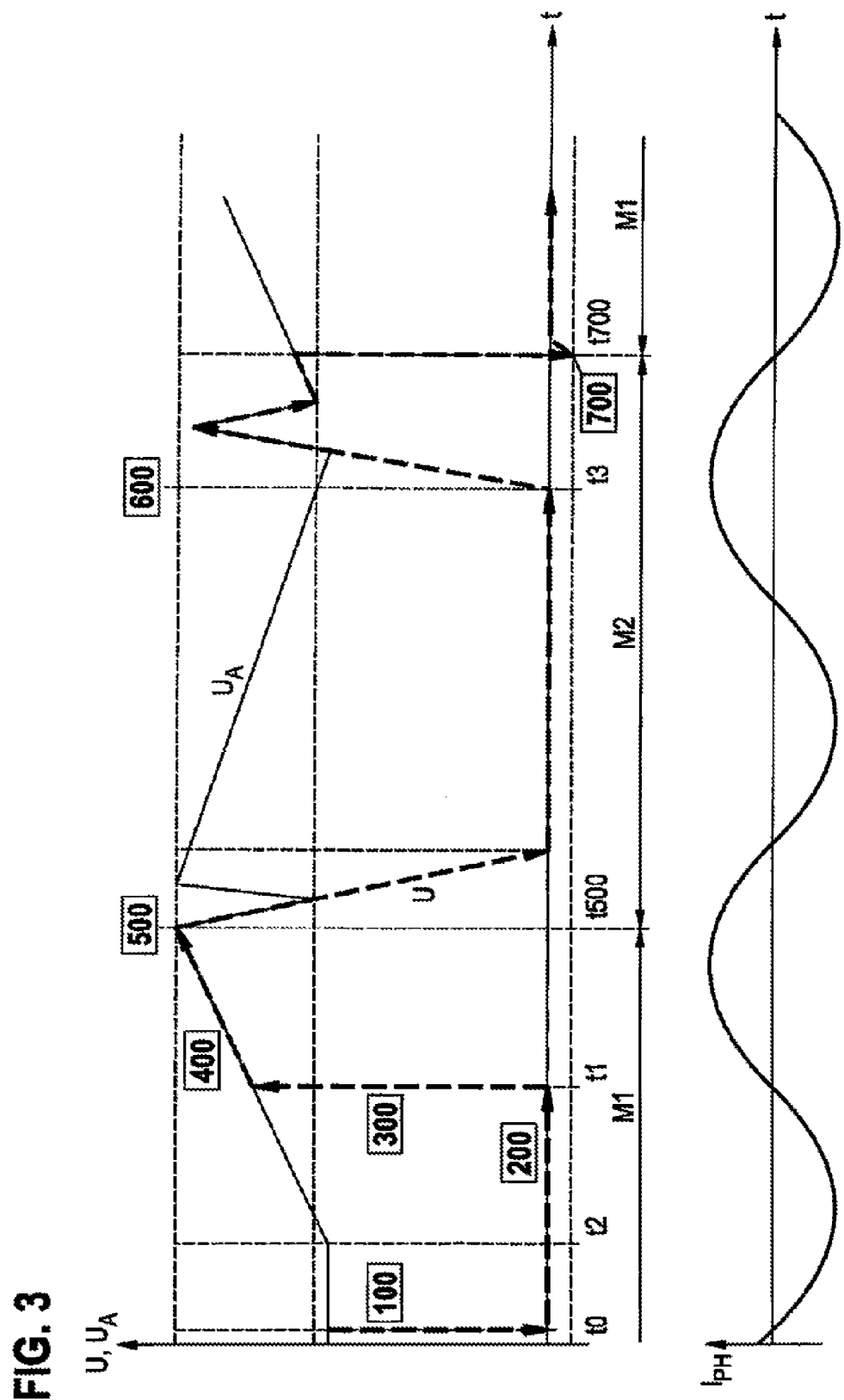
FIG. 3 shows voltage curves in a schematic representation.
Figure 4:
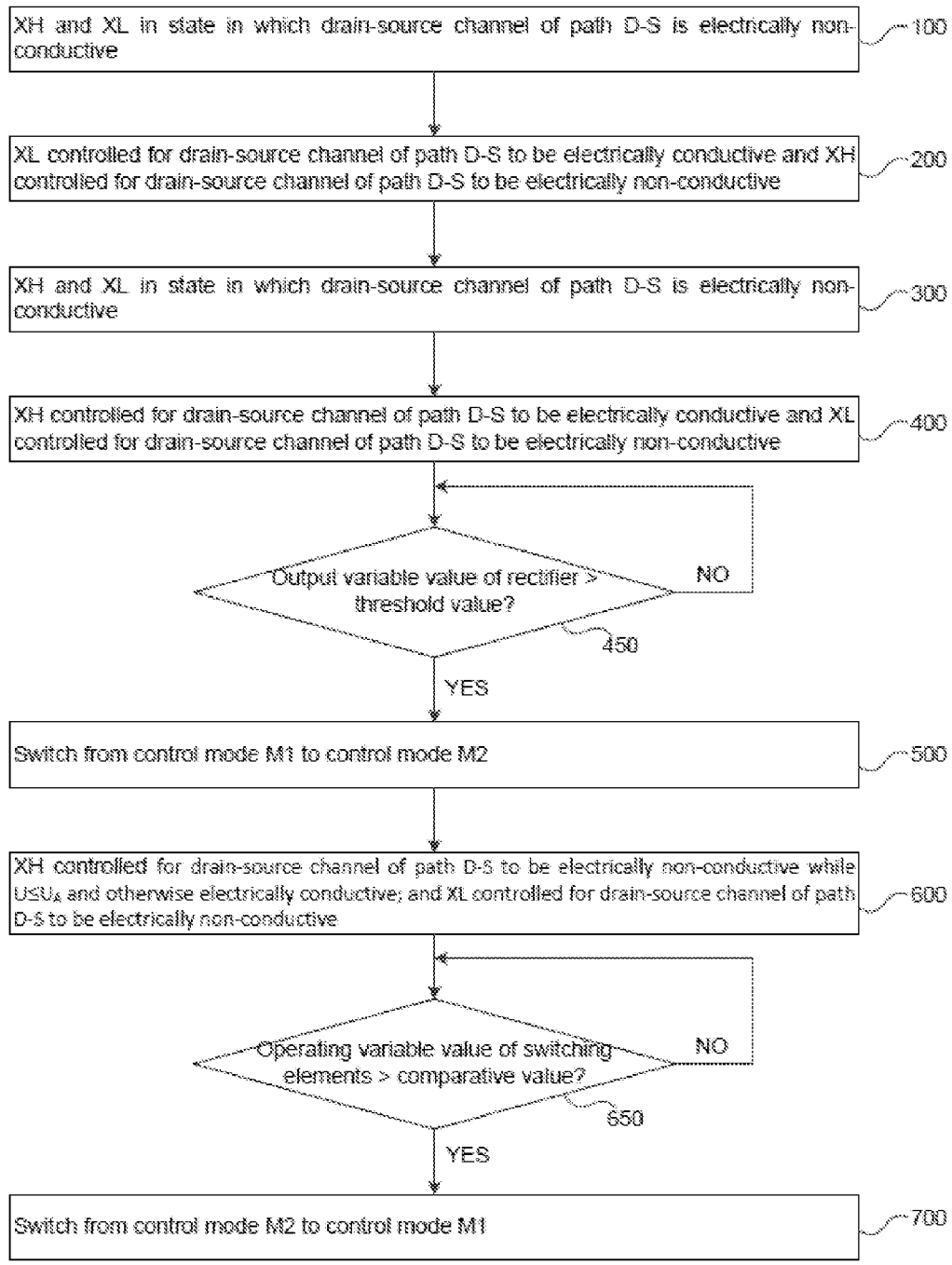
FIG. 4 shows a method sequence in a schematic representation.

FIG. 3 shows voltage $U_A$ at DC voltage terminal B+ of active rectifier 4 and an AC voltage U of one of phases U through Y having a trapezoidal curve, which is rectified by rectifier 4. Furthermore the sequence of the positive and negative half waves of the generally sinusoidal generator current $I_{PH}$ of the same phase is provided.

As shown in FIG. 3, the considered phase of circuit system 2 is operated by active rectifier 4 in a first control mode M1 during the time period t0 through t500, while the considered phase of circuit system 2 is operated by active rectifier 4 in a second control mode M2 in the time period t500 through t700. In the time period after t700, the considered phase of circuit system 2 is again operated by active rectifier 4 in first control mode M1, until the condition for control mode M2 is present again. The other phases have a phase shift in relation to the considered phase, but behave analogously to the considered phase, taking their phase positions into consideration and with respect to the criteria for the transition between control modes M1 and M2. Explicitly, this means that ideally they switch from control mode M1 into control mode M2 at the same point in time t500. The detection, evaluation, and implementation of the criteria for entering into and leaving the phase short circuit also ideally take place at identical points in time t500 and t3. The switch from control mode M2 back into control mode M1, however, depends on the phase position, as is described hereafter, and thus occurs time-shifted in relation to the considered phase.

Semiconductor switching elements AH through EH and AL through EL are controlled with a first switching time in first control mode M1, and semiconductor switching elements AL through EL are controlled with a second switching time in second control mode M2, the second switching time being greater than the first switching time. According to the present exemplary embodiment, the operation in first control mode M1 takes place during an active rectifier operation, while the operation in second control mode M2 takes place during a phase short circuit until the condition is met for returning into control mode M1.

Figure 5:
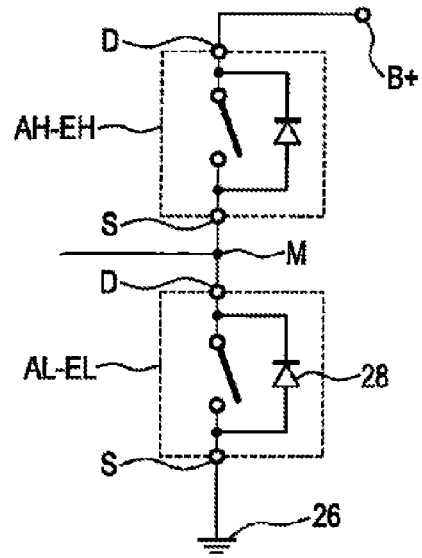
FIG. 5 shows a section of FIG. 2 in detail during a method step.
Figure 6:
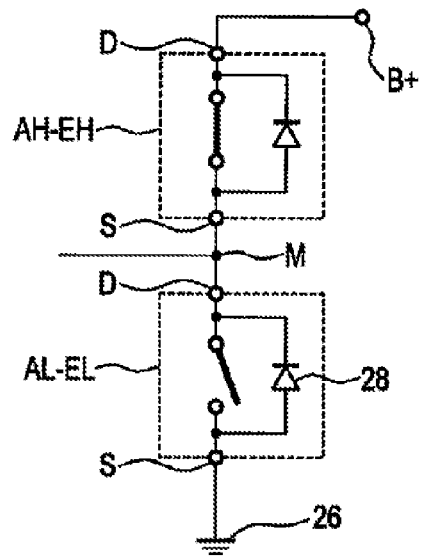
FIG. 6 shows a section of FIG. 2 in detail during a further method step.
Figure 7:
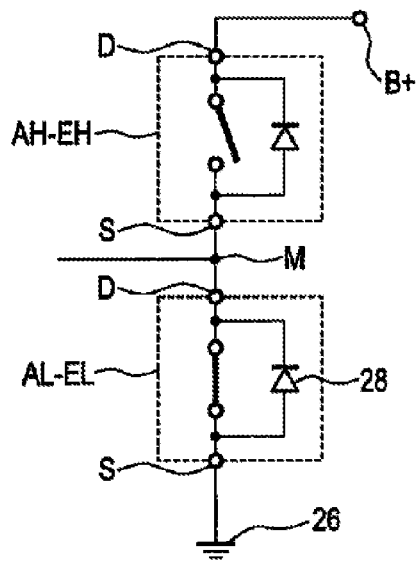
FIG. 7 shows a section of FIG. 2 in detail during a further method step.
Figure 8:
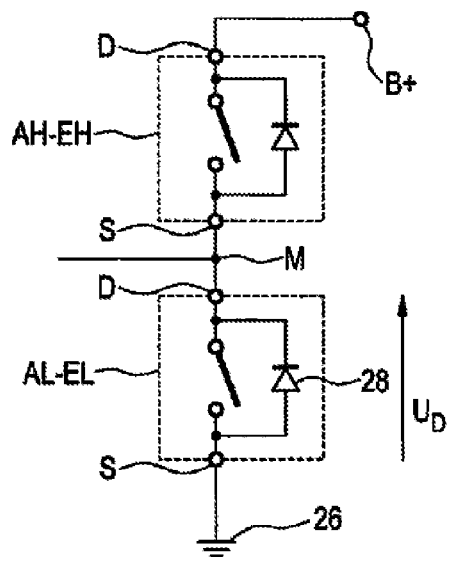
FIG. 8 shows a section of FIG. 2 in detail during a further method step.

If, thereafter, one of phases A through E is considered again, which hereafter is denoted by X by way of example (the switching elements are correspondingly denoted by XH and XL, the center tap by MX, and a voltage by UX), the method according to the present invention is as follows:

In the beginning, at point in time t0 (see FIG. 3), in a first step 100 (see FIG. 4) semiconductor switching element XH on the high side and semiconductor switching element XL on the low side are ideally in a state in which the drain-source channel of drain-source path D-S is electrically non-conductive (see FIG. 5).

Between points in time t0 and t1 (see FIG. 3), the negative half wave of AC voltage UX is present at center tap MX. In a second step 200 (see FIG. 4), semiconductor switching element XL on the low side is controlled by second partial control unit 16 in such a way that the drain-source channel of drain-source path D-S is electrically conductive, while semiconductor switching element XH on the high side is controlled by first partial control unit 14 in such a way that the drain-source channel of drain-source path D-S is electrically non-conductive (see FIG. 7). An electric current flows through semiconductor switching element XL on the low side as a function of the polarity of the voltage UX present at center tap M. Thus, an active rectifier operation is present.

At point in time t1 (see FIG. 3), in a further step 300 (see FIG. 4) semiconductor switching element XH on the high side and semiconductor switching element XL on the low side are ideally in a state in which the drain-source channel of drain-source path D-S is electrically non-conductive (see FIG. 5).

Starting at point in time t1 (see FIG. 3), the positive half wave of AC voltage UX is present at center tap MX. In a further step 400 (see FIG. 4), semiconductor switching element XH on the high side is controlled by first partial control unit 14 in such a way that drain-source path D-S is electrically conductive, while semiconductor switching element XL on the low side is controlled by second partial control unit 16 in such a way that the drain-source channel of drain-source path D-S is electrically non-conductive (see FIG. 6). An electric current flows through semiconductor switching element XH on the high side as a function of the polarity of the voltage UX present at center tap MX. Thus, an active rectifier operation is present.

At point in time t2, a load drop occurs (see FIG. 3), whereupon, as described at the outset, the voltage at terminal B+ of the active rectifier rises. To detect the load drop, a value of an electrical output variable of rectifier 4 is detected. At step 450, this value is compared to a threshold value, and a switch is carried out in a step 500 (see FIG. 4) from first control mode M1 into second control mode M2 when the value is greater than the threshold value. Detecting and comparing are understood to mean that values are constantly detected and continuously compared to a reference value. According to the present exemplary embodiment, it is provided that the electrical output variable is filtered to determine the value, interfering variables being filtered out. The electrical output variable in the present exemplary embodiment is an electric output voltage $U_A$ present at DC voltage terminal B+. When the value of electric output voltage $U_A$ present at DC voltage terminal B+ is greater than the threshold value, a switch is made from first control mode M1 into second control mode M2.

The switch from first control mode M1 into second control mode M2 is carried out in two substeps according to one exemplary embodiment. In a first substep, all semiconductor switching elements AH through EH on the high side are controlled by first partial control unit 14 in such a way that the drain-source channel of drain-source path D-S is electrically non-conductive. Furthermore, switchable impedance 20 is brought from the low-resistance into the high-resistance state. In a second substep, semiconductor switching elements AL through EL on the low side are slowly controlled by second partial control unit 16 with the aid of current source 22 in such a way that the drain-source channel of drain-source path D-S slowly becomes electrically conductive (for final state see FIG. 7). A phase short circuit is now present. An operation in second control mode M2 is present.

At point in time t3 (see FIG. 3), the value drops below the further threshold value. This triggers a process in a step 600 (see FIG. 4) in which, in a first stage, semiconductor switching element XH on the high side is controlled by first partial control unit 14 in such a way that the drain-source channel of drain-source path D-S remains electrically non-conductive as long as $U \le U_A$, while the drain-source channel of drain-source path D-S of semiconductor switching element XL on the low side is controlled by current source 22 of second partial control unit 16 in such a way that it becomes electrically non-conductive (see FIG. 8). According to one exemplary embodiment, semiconductor switching element XL on the low side is controlled according to second control mode M2, i.e., with the second, greater switching time, in order to reduce or entirely prevent voltage peaks occurring as a result of inductances. Consequently, the value of drain-source voltage UX and thus the voltage at center tap MX change. When drain-source voltage U exceeds voltage $U_A$ at DC voltage terminal B+, semiconductor switching element XH on the high side is controlled by first partial control unit 14 in such a way that the drain-source channel of drain-source path D-S becomes electrically conductive. An electric current flows in this case from center tap MX of the considered phase through semiconductor switching element XH to DC voltage terminal B+ until the electric current changes its direction and body diode 28 of semiconductor switching element XL on the low side is energized. For this purpose, semiconductor switching element XL on the high side is accordingly controlled by first partial control unit 14 if necessary.

In one alternative specific embodiment, instead of detecting and evaluating electric output voltage $U_A$, it is also possible to detect and evaluate the drain-source voltage of the high-side semiconductor switching elements AH through EH to initiate the release of the phase short circuit.

To detect whether a switch from second control mode M2 into first control mode M1 is necessary, a value of an electrical operating variable of semiconductor switching elements AL through EL is detected, and, at step 650, the value is compared to a comparative value. If the value is greater than the comparative value, a switch is carried out from second control mode M2 into first control mode M1.

This is the case in the described example (see FIG. 3) at point in time t700; the switch is carried out in step 700.

According to the present exemplary embodiment, it is provided that a voltage $U_D$ is used as the electrical operating variable. According to the present exemplary embodiment, it is provided, for example, that a source-drain voltage of semiconductor switching elements AL through EL is used as voltage $U_D$, which in the case of the non-conductive drain-source channel is the voltage $U_D$ dropping across body diode 28. This is a positive voltage if the current flows from source to drain. The value of this voltage is greater than the value of the voltage that arises with a conductive drain-source channel and when a current flows from source to drain.

According to the present exemplary embodiment, the comparative value of the voltage furthermore exceeds the greatest value of the voltage that arises with a conductive drain-source channel and a maximum current from source to drain. This is also a positive voltage.

Since in the selected example the negative half wave of the electric current is present and UX<0V, semiconductor switching element XL on the low side is controlled by second partial control unit 16 as in step 200 of control mode M1 in the time period between t0 and t1 in such a way that the drain-source channel of drain-source path D-S is electrically conductive, while semiconductor switching element XH on the high side is controlled by first partial control unit 14 in such a way that the drain-source channel of drain-source path D-S is electrically non-conductive. In this way, the state shown in FIG. 6 is reached again.

A further specific embodiment differs from the one just described in that semiconductor switching element AH through EH on the high side is not controlled by first partial control unit 14 in the time period between t3 and t700 in such a way that the drain-source channel of drain-source path D-S becomes electrically conductive when U>$U_A$. In this case, with an appropriate phase position, an electric current flows from center tap M of the considered phase through body diode 28 of semiconductor switching element AH through EH to DC voltage terminal B+. A control of semiconductor switching element AH through EH on the high side by first partial control unit 14 in such a way that drain-source path D-S becomes electrically conductive only becomes possible again after a return into control mode M1, and is then carried out in the manner described for the active rectification.

According to a further specific embodiment, the phase short circuit is carried out to DC voltage terminal B+ of active rectifier 4. In this case, only first partial control unit 14 is switchable between control modes M1 and M2; however, second partial control unit 16 is not.

Partial control unit 16 thus in this case includes the components and circuit of partial control unit 14 of the specific embodiment in which the phase short circuit to ground terminal 26 is carried out, and vice versa. In contrast, the criterion for switching from control mode M1 into control mode M2 and for the deactivation/activation of the phase connection remains unchanged, as does the electric interconnection of partial control unit 14 to semiconductor switching elements AH through EH and of partial control unit 16 to semiconductor switching elements AL through EL. In contrast, the criterion for switching from control mode M2 into control mode M1 is modified in such a way that the voltage U is compared to electric output voltage $U_A$, and the transition is carried out when voltage U exceeds electric output voltage $U_A$ by at least one comparative value which is greater than the maximum value of the voltage which arises with a conductive drain-source channel and a current flow from source to drain in semiconductor switching elements AH through EH.

In one alternative specific embodiment, instead of detecting and evaluating electric output voltage $U_A$, it is also possible to detect and evaluate the drain-source voltage of the low-side semiconductor switching elements AL through EL to initiate the release of the phase short circuit at point in time t3.

What is claimed is:

1. A method for operating an active rectifier including a plurality of controllable semiconductor switching elements, in which a switch is carried out between a first control mode and a second control mode for controlling the semiconductor switching elements, and vice versa, the operation in the first control mode occurring during an active rectifier operation and the operation in the second control mode occurring during a phase short circuit until a condition for returning to the control mode sets in, the semiconductor switching elements being controlled with a first switching time in the first control mode and with a second switching time in the second control mode, the second switching time being greater than the first switching time, the method comprising:
   a) detecting an output variable value of an electrical output variable of the rectifier;
   b) comparing the output variable value to a threshold value; and
   c) switching from the first control mode into the second control mode when the output variable value is greater than the threshold value.

2. The method as recited in claim 1, further comprising:
   d) detecting an operating variable value of an electrical operating variable of one of the semiconductor switching elements;
   e) comparing the operating variable value to a comparative value; and
   f) switching from the second control mode into the first control mode when the operating variable value is greater than the comparative value.

3. The method as recited in claim 2, wherein a voltage is used as the electrical operating variable.

4. The method as recited in claim 3, wherein MOSFETs which each have a body diode are used as the semiconductor switching elements, a source-drain voltage of one of the semiconductor switching elements being used as the voltage.

5. The method as recited in claim 4, wherein the value of the voltage is between 0 volts and a voltage which drops across the body diode.

6. The method as recited in claim 2, wherein:
   an output-side load dump at the rectifier is detected; and a switch is carried out from the first control mode into the second control mode in response to the output-side load dump.

7. The method as recited in claim 6, wherein for the detection of the load dump:
   a value of an electrical output variable of the rectifier is detected;
   the value of the electrical output variable is compared to a threshold value; and
   a switch is carried out from the first control mode into the second control mode when the value is greater than the threshold value.

8. The method as recited in claim 7, wherein the electrical output variable is filtered to determine the value.

9. The method as recited in claim 8, wherein an electric output voltage is used as the electrical output variable.

10. A method for operating an active rectifier including a plurality of controllable semiconductor switching elements, in which a switch is carried out between a first control mode and a second control mode for controlling the semiconductor switching elements, and vice versa, the operation in the first control mode occurring during an active rectifier operation and the operation in the second control mode occurring during a phase short circuit until a condition for returning to the control mode sets in, the semiconductor switching elements being controlled with a first switching time in the first control mode and with a second switching time in the second control mode, the second switching time being greater than the first switching time, the method comprising:
   d) detecting an operating variable value of an electrical operating variable of one of the semiconductor switching elements;
   e) comparing the operating variable value to a comparative value; and
   f) switching from the second control mode into the first control mode when the operating variable value is greater than the comparative value.

11. A circuit system, comprising:
   an active rectifier having a plurality of controllable semiconductor switching elements, the semiconductor switching elements being operable in a first control mode and in a second control mode, the semiconductor switching elements being controllable with a first switching time in the first control mode and with a second switching time in the second control mode, the second switching time being greater than the first switching time; and
   a control unit, configured to:
      a) detect an output variable value of an electrical output variable of the rectifier;
      b) compare the output variable value to a threshold value;
      c) switch from the first control mode into the second control mode when the output variable value is greater than the threshold value;
      d) detect an operating variable value of an electrical operating variable of one of the semiconductor switching elements;
      e) compare the operating variable value to a comparative value; and
      f) switch from the second control mode into the first control mode when the operating variable value is greater than the comparative value.

12. A non-transitory machine-readable storage medium storing a computer program for operating an active rectifier including a plurality of controllable semiconductor switching elements, in which a switch is carried out between a first control mode and a second control mode for controlling the semiconductor switching elements, and vice versa, the operation in the first control mode occurring during an active rectifier operation and the operation in the second control mode occurring during a phase short circuit until a condition for returning to the control mode sets in, the semiconductor switching elements being controlled with a first switching time in the first control mode and with a second switching time in the second control mode, the second switching time being greater than the first switching time, the computer program, when executed on a processor, causing the processor to perform:
   a) detecting an output variable value of an electrical output variable of the rectifier;
   b) comparing the output variable value to a threshold value;
   c) switching from the first control mode into the second control mode when the output variable value is greater than the threshold value;
   d) detecting an operating variable value of an electrical operating variable of one of the semiconductor switching elements;
   e) comparing the operating variable value to a comparative value; and
   f) switching from the second control mode into the first control mode when the operating variable value is greater than the comparative value.

* * * * *